Figure 1:
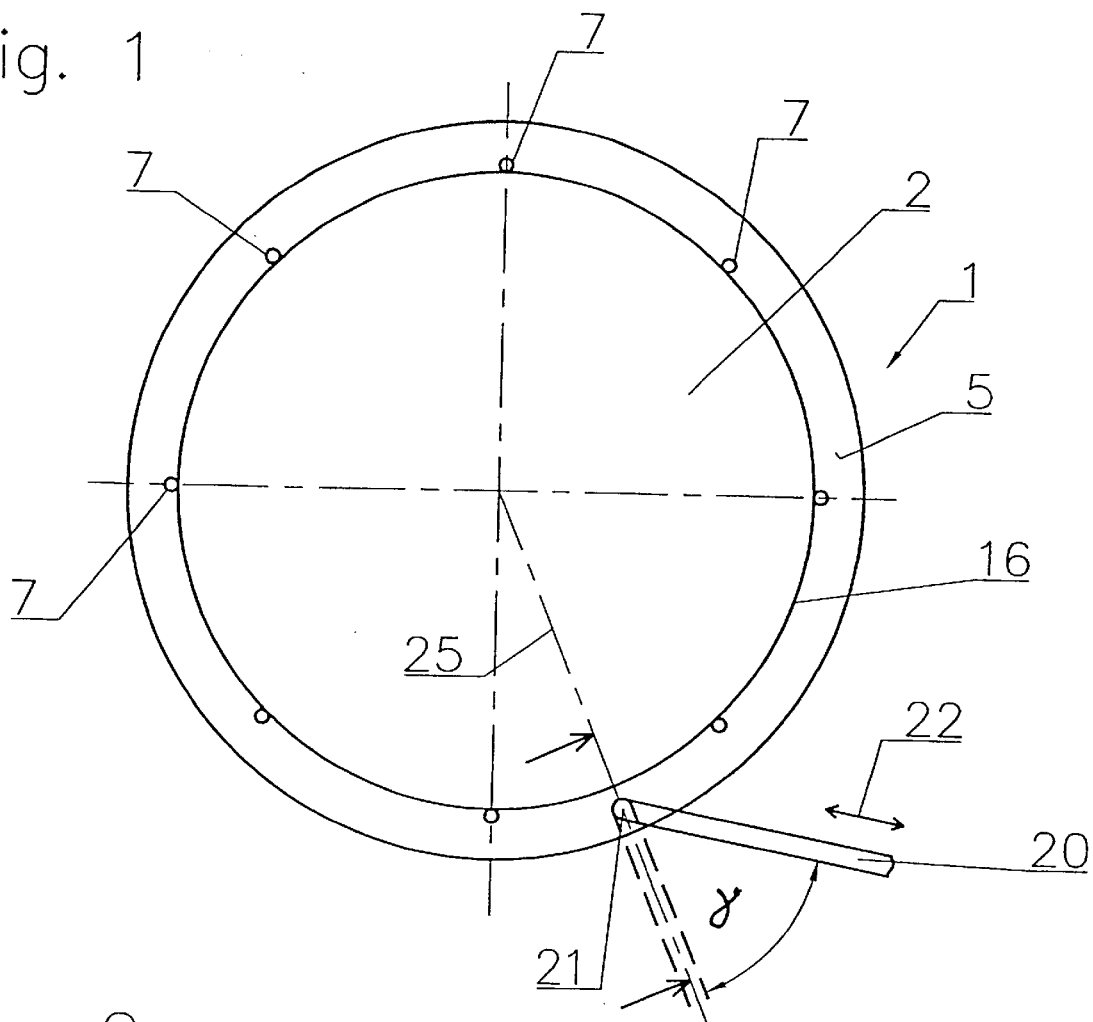

United States Patent [19]
Wagner et al.

[11] Patent Number: 5,904,164
[45] Date of Patent: May 18, 1999

[54] ARRANGEMENT FOR TREATMENT OF WAFER-SHAPED ARTICLES, PARTICULARLY SILICON WAFERS

[75] Inventors: Gerald Wagner, Velden; Helmut Frey, Ferlach, both of Austria

[73] Assignee: SEZ Semiconductor-Equipment Zubehor fur die Halbleiterfertigung AG, Villach, Austria

[21] Appl. No.: 09/080,236

[22] Filed: May 18, 1998

[30] Foreign Application Priority Data

May 23, 1997 [AT] Austria ........................................ 886/97

[51] Int. Cl.⁶ ....................................................... B08B 3/04
[52] U.S. Cl. ........................... 134/148; 134/95.3; 134/172; 134/153; 118/320; 118/323; 118/52
[58] Field of Search ..................... 134/95.3, 198, 134/172, 148, 153; 118/320, 323, 52

[56] References Cited

U.S. PATENT DOCUMENTS

| 3,342,562 | 9/1967 | Reisman et al. . | |
| 4,838,289 | 6/1989 | Kottman et al. | 134/153 |
| 4,903,717 | 2/1990 | Sumnitsch | 134/99 |
| 5,028,955 | 7/1991 | Hayashida et al. | 355/53 |
| 5,116,250 | 5/1992 | Sago et al. | 118/52 |
| 5,139,132 | 8/1992 | Licht | 198/376 |
| 5,209,028 | 5/1993 | McDermott et al. . | |
| 5,209,180 | 5/1993 | Shoda et al. . | |
| 5,235,995 | 8/1993 | Bergman et al. | 134/105 |
| 5,349,978 | 9/1994 | Sago et al. | 134/153 |
| 5,384,986 | 1/1995 | Hirose | 451/444 |
| 5,529,626 | 6/1996 | Stewart | 118/500 |
| 5,545,076 | 8/1996 | Yun et al. | 451/287 |
| 5,584,310 | 12/1996 | Bergman et al. | 134/95.1 |
| 5,608,943 | 3/1997 | Konishi et al. . | |
| 5,706,930 | 1/1998 | Sahoda et al. | 198/464.2 |
| 5,725,414 | 3/1998 | Moinpour et al. | 451/41 |

FOREIGN PATENT DOCUMENTS

| 0 753 884 | 1/1997 | European Pat. Off. . | |
| 3-274722 | 12/1991 | Japan | 134/902 |
| 3-286530 | 12/1991 | Japan | 134/902 |
| 4-71232 | 3/1992 | Japan | 134/902 |
| 5-121388 | 5/1993 | Japan | 134/902 |
| 6-120192 | 4/1994 | Japan | 134/902 |
| 6-123887 | 5/1994 | Japan | 134/902 |
| WO 96/35227 | 11/1996 | WIPO . | |

Primary Examiner—Frankie L. Stinson
Assistant Examiner—Paul J. Lee
Attorney, Agent, or Firm—Young & Thompson

[57] ABSTRACT

In order to remove, after treatment of wafer-shaped articles (2), preferably a silicon wafer, with a treatment medium, preferably with an etching fluid, on the bottom of wafer-shaped article (2), i.e. the side facing chuck (1) for wafer-shaped article (2), residual treatment medium adhering in its edge area, there is nozzle (20) from which flushing liquid, preferably deionized water, can be sprayed onto the outside edge of article (2) and between chuck (1) and wafer-shaped article (2). The flushing liquid, which penetrates more or less deeply, depending on the pressure with which the flushing liquid emerges from nozzle (20) and depending on the alignment of nozzle (20) relative to wafer-shaped article (2), is flung off again by the rotation of wafer-shaped article (2) and in doing so entrains residues of treatment medium. For optimum action the alignment of nozzle (20) can be changed relative to edge (16) of wafer-shaped article (2).

8 Claims, 2 Drawing Sheets

ARRANGEMENT FOR TREATMENT OF WAFER-SHAPED ARTICLES, PARTICULARLY SILICON WAFERS

The invention relates to an arrangement with the features of the introductory part of claim 1.

Wafer-shaped articles, preferably silicon wafers, are held on chucks during their treatment, for example, during etching, and are caused to rotate by these chucks while treatment with an etching medium takes place. After etching, flushing is done with a flushing liquid, for example, water, to remove the etching medium.

It has been found that especially in the area of the outside edge of the side of the wafer-shaped article facing the chuck, even after flushing with a flushing liquid, especially (deionized) water which is applied to the article to the (top) side facing away from the chuck, acid residues remain; this is not desirable.

An arrangement with the features of the introductory part of patent claim 1 is known from EP 753 884 A and from WO 96/35227. With the nozzles for flushing liquid of the known arrangements however only the (upward pointing) side of a wafer-shaped article facing away from the chuck can be flushed. The problem of residual etching media remaining on the (bottom) side of the article pointing towards the chuck is not solved with the known arrangements.

The object of the invention is to make available an arrangement of the initially mentioned type with which acid residues can be reliably removed in the area of the edge of the wafer-shaped article on its side facing the chuck.

This object is achieved with an arrangement with the features of the characterizing part of claim 1.

With the arrangement as claimed in the invention, the wafer-shaped article, preferably a silicon wafer, after etching and underetching (etching in the area of the outer edge of the side facing the chuck) is sprayed in the edge area with a flushing liquid which emerges from a nozzle, preferably deionized water. Depending on the alignment of the nozzle or the pressure of the jet of the flushing agent, the flushing liquid can penetrate more or less far between the wafer-shaped article and the chuck and shortly thereafter is flung off again due to the rotation of the article and in doing so takes the acid residue with it.

Preferred and advantageous embodiments of the arrangement as claimed in the invention are the subject of the subclaims.

Other details, features and advantages of the arrangement as claimed in the invention follow from the following description of the embodiment shown schematically in the drawings.

Figure 2:
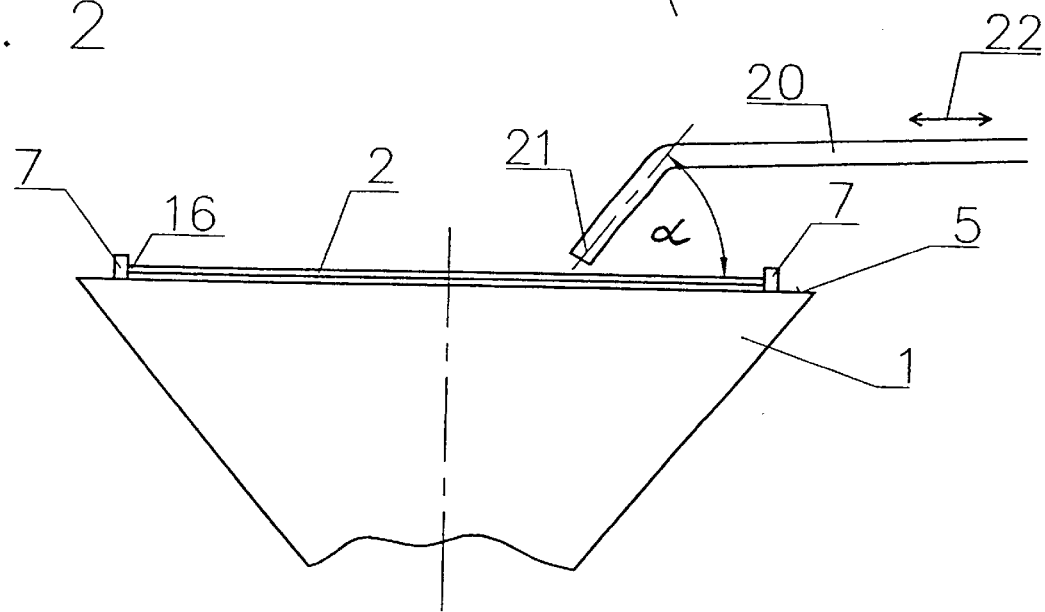
Figure 3:
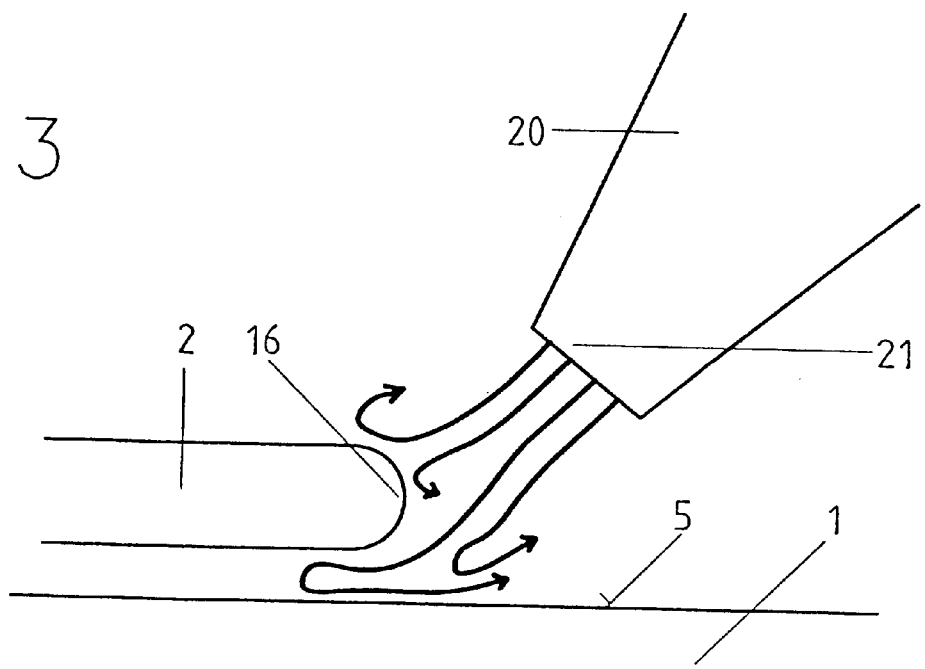

FIG. 1 shows in an overhead view a chuck with a wafer-shaped article located thereon and with a nozzle for flushing liquid, FIG. 2 shows a side view of a chuck with a wafer-shaped article located thereon and the nozzle from FIG. 1, and FIG. 3 in an enlarged representation shows a detail of FIG. 2.

As is shown in FIG. 1, nozzle 20 is assigned to chuck 1 in which article 2 is held, nozzle mouth 21 can be positioned next to outer edge 16 of wafer-shaped article 2 by moving nozzle 20 in the direction of double arrow 22. Article 2, for example, a (silicon) wafer, is held on chuck 1 either by the Bernoulli principle and supported laterally by peg 7, or is held by a vacuum. A rotary drive can be assigned to chuck 1 so that article 2 can be rotated during treatment.

Flushing liquid, for example, deionized water, which is applied from nozzle 20, strikes the outer edge of article 2 and surface 5 of chuck 1 pointing upward and penetrates between wafer-shaped article 2 and surface 5 of chuck 1 facing it. The amount of penetration of flushing liquid depends on the pressure with which flushing liquid emerges from nozzle 20 and can also be adjusted additionally by changing angle γ included by the axis of nozzle 20 or its mouth 21 with radial plane 25. In addition, for the amount of penetration of flushing liquid angle α between the axis of mouth 21 and nozzle 20, therefore the jet of flushing liquid and surface 5 of chuck 1, is also critical.

With nozzle 20 which is assigned to chuck 1 and which is shown in FIGS. 1 and 2, after wafer-shaped article 2 (for example, a silicon wafer) has been etched in its edge area on its bottom facing chuck 1 (underetching), it is possible to reliably provide for effectively removing acid residues remaining in the underetching area with flushing by the flushing medium applied to the top (side facing away from chuck 1) of article 2 in its bottom edge area. In addition, nozzle 20, while flushing liquid is being sprayed out of it, for example also in the direction of double arrow 22, can execute oscillating movements in order to improve the flushing action. Also angle γ included by nozzle 20 and the axis of its mouth 21 with radial plane 25, and/or angle α included by the axis of nozzle mouth 21 with the plane of article 2, can be changed to achieve optimum results. The setting of angle α and γ, once chosen, can be maintained or (periodically) changed during a flushing process.

The flushing liquid applied from nozzle 20, preferably deionized water, penetrates as described above, and depending on the pressure of the flushing liquid and the alignment of nozzle 20 penetrates more or less far between article 2 and surface 5 of chuck 1 facing it, and due to rotation of chuck 1 and thus of article 2 around the axis of chuck 1, is flung off again, on the bottom of wafer-shaped article 2 likewise entraining etching medium which is still adhering. This is shown schematically in FIG. 3. FIG. 3 also shows that the flushing liquid emerging from nozzle 20 also flushes the outer edge of the top of article 2, therefore penetrates not only (to a limited agree) between article 2 and chuck 1.

One preferred embodiment of the arrangement as claimed in the invention can be described as follows:

In order to remove, after treatment of wafer-shaped articles 2, preferably a silicon wafer, with a treatment medium, preferably with an etching fluid, on the bottom of wafer-shaped article 2, i.e. the side facing chuck 1 for wafer-shaped article 2, residual treatment medium adhering in its edge area, there is nozzle 20 from which flushing liquid, preferably deionized water, can be sprayed onto the outside edge of article 2 and between chuck 1 and wafer-shaped article 2. The flushing liquid which penetrates more or less deeply, depending on the pressure with which the flushing liquid emerges from nozzle 20 and depending on the alignment of nozzle 20 relative to wafer-shaped article 2 is flung off again by the rotation of wafer-shaped article 2 and in doing so entrains residues of treatment medium. For optimum action the alignment of nozzle 20 can be changed relative to edge 16 of wafer-shaped article 2.

We claim:

1. Arrangement for treatment of wafer-shaped articles (2), especially silicon wafers, with chuck (1) which can turn around its axis jointly with article (2) held thereon, and with nozzle (20) for flushing liquid which is located above the plane of surface (5) of chuck (1) facing article (2) and which is sloped to this plane, characterized in that the axis of mouth (21) of nozzle (20) is aligned to the edge area of wafer-shaped article (2) in order to spray flushing liquid out of the nozzle onto the edge area of the top of wafer-shaped article (2) and between surface (5) of chuck (1) facing article (2) and the edge area of the bottom of article (2).

2. Arrangement as claimed in claim 1, wherein nozzle (20) can be adjusted relative to chuck (1).

3. Arrangement as claimed in claim 2, wherein nozzle (20) is movably held in its longitudinal direction (arrow 22).

4. Arrangement as claimed in claim 1, wherein nozzle (20) is held to swivel.

5. Arrangement as claimed in claim 1, wherein nozzle (20) can be swivelled out of the position in which it lies in radial plane (25) which passes through the axis of chuck (1), into a position which is roughly tangential to edge (16) of wafer-shaped article (2).

6. Arrangement as claimed in claim 1, wherein mouth (21) of nozzle (20) in its position assigned to edge (16) of wafer-shaped article (2) is located directly next to edge (16) of wafer-shaped article (2).

7. Arrangement as claimed in claim 1, wherein the axis of mouth (21) of nozzle (20) includes an acute angle ($\alpha$) with surface (5) of chuck (1) facing article (2).

8. Arrangement as claimed in claim 1, wherein the axis of mouth (21) of nozzle (20) includes an acute angle ($\gamma$) with radial plane (25) passing through mouth (21) of nozzle (20) and the axis of chuck (1).

\* \* \* \* \*